United States Patent [19]
Rybicki et al.

[11] Patent Number: 5,596,301
[45] Date of Patent: Jan. 21, 1997

[54] APPARATUS FOR A SYNTHESIZED REACTANCE CONTROLLED OSCILLATOR USABLE IN A PHASE LOCKED LOOP

[75] Inventors: Mathew A. Rybicki; Michael D. Cave, both of Austin, Tex.

[73] Assignee: Motorola, Inc., Schaumburg, Ill.

[21] Appl. No.: 435,104

[22] Filed: May 4, 1995

[51] Int. Cl.⁶ .............................. H03B 5/32; H03L 7/099
[52] U.S. Cl. ................... 331/36 R; 331/116 FE; 331/135; 331/158; 331/177 R; 331/177 V
[58] Field of Search ............... 331/116 R, 116 FE, 331/158, 177 R, 34, 36 R, 108 B, 135, 177 V

[56] References Cited

U.S. PATENT DOCUMENTS

| | | | |
|---|---|---|---|
| 3,614,649 | 10/1971 | Gerig | 331/135 |
| 4,234,858 | 11/1980 | Gomi | 331/117 R |
| 4,583,059 | 4/1986 | Konno | 331/117 R |
| 4,916,412 | 4/1990 | Nordholt et al. | 331/135 |
| 5,030,926 | 7/1991 | Walden | 331/117 V |
| 5,347,238 | 9/1994 | Kobayashi | 331/117 R |

*Primary Examiner*—Siegfried H. Grimm
*Attorney, Agent, or Firm*—J. Gustav Larson

[57] ABSTRACT

The output frequency (14) of an oscillator circuit (10) can be controlled by replacing at least one of the reactive components (40), such as a capacitor or inductor, with a synthesized element (22). The synthesized element creates a signal that corresponds to the response of the reactive component it is replacing. The synthesized element may be a current source (44), such as a field effect transistor, that is capable of operating at low voltages.

28 Claims, 7 Drawing Sheets

5,596,301

APPARATUS FOR A SYNTHESIZED REACTANCE CONTROLLED OSCILLATOR USABLE IN A PHASE LOCKED LOOP

FIELD OF THE INVENTION

This invention relates generally to oscillator circuits, and more specifically to a method and apparatus for controlling such oscillator circuits.

BACKGROUND OF THE INVENTION

Oscillation circuits are known to be used in phase locked loop circuits (PLLs) and enable the PLL to generate precise frequency outputs based on a given reference signal frequency. As is also known, PLLs are used in a wide variety of applications that require accurate synchronization between signals. For example, processing circuits (i.e., digital signal processors, microprocessors, microcomputers, microcontrollers, etc.) use PLLs to ensure synchronization of circuit elements. Wireless communication devices (such as mobile radios, cellular telephones, and transmission sites) also use PLLs to ensure proper tuning of transmitters and receivers such that a wireless communication can occur. Data recovery systems, such as Asynchronous Transfer Mode (ATM), Asymmetrical Digital Subscriber Line (ADSL), and Integrated Services Digital Network (ISDN), use PLLs to recover clock signals from incoming data streams.

PLLs generally produce an output frequency based on some multiple of the reference signal frequency via a phase-detect stage, a voltage controlled oscillator, and a feedback stage. The phase-detect stage compares the reference signal frequency to an internally generated feedback oscillation signal and generates a frequency adjusting signal based on the phase relationship of these two signals. This frequency adjusting signal regulates the output frequency signal produced by the voltage controlled oscillator (VCO), wherein the output frequency signal is divided by the feedback stage to produce the feedback oscillation signal. As the reference signal frequency changes, the phase-detect stage detects the change and adjusts the frequency adjusting signal such that the output frequency signal remains "locked" with the reference signal frequency.

One prior-art VCO is shown in FIG. 1 to include a varactor, a first capacitor, an inverter, a crystal oscillator, a second capacitor, a buffer, and resistors. In operation, the output frequency, which is provided at the output of the buffer, is adjusted based on the frequency adjusting signal. The frequency adjusting signal varies the capacitance of the varactor, thereby changing the capacitive load at the oscillator, causing the output frequency to be adjusted. While this type of VCO works well for typical supply voltages (5 volts), it does not support low voltage applications (supply voltages less than 3 volts) due to limitations of the varactor.

A second type of VCO is shown in FIG. 2. In this implementation, the frequency is digitally adjusted by controlling a series of switching elements, each with an associated capacitor, to change the capacitance at the oscillator. As switching elements are controlled, the value of their associated capacitors is added, or subtracted, to create a variable capacitance node. As with the varactor implementation, this change in capacitance causes the output frequency to change. One problem with the implementation of FIG. 2 is that the output frequency can only be changed in steps due the step changes of the capacitance values, resulting in a loss of accuracy. A second problem with the implementation of FIG. 2 is that a large amount of space is required for the necessary capacitors; this causes unnecessary system costs.

Therefore, a need exists for an oscillator, which may be incorporated in a PLL, that can operate with a high degree of accuracy at low voltages, without utilizing unnecessary space.

DETAILED DESCRIPTION OF THE DRAWINGS

Figure 1:
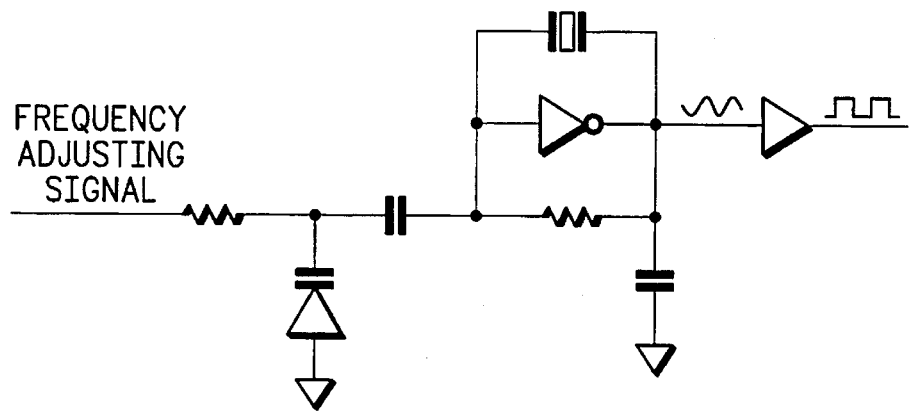
FIG. 1 illustrates, in a schematic diagram, a prior-art circuit for controlling an oscillator using a varactor.
Figure 2:
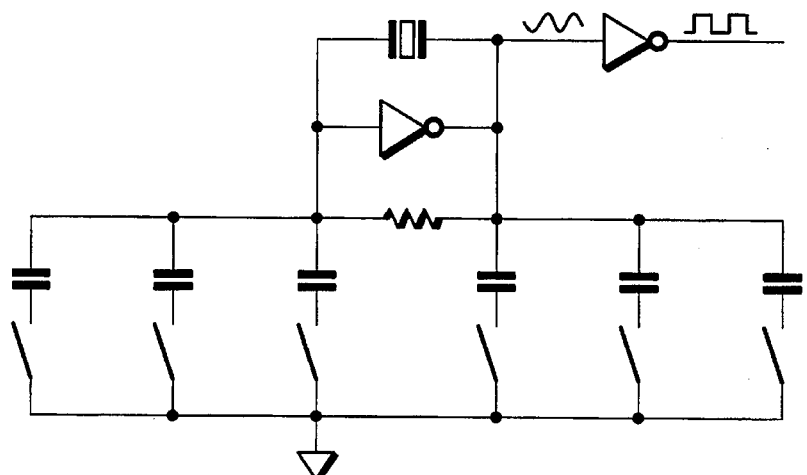
FIG. 2 illustrates, in a schematic diagram, a prior-art circuit for controlling an oscillator using digital switches.

Generally, the present invention provides a method and apparatus for controlling an oscillator. This is accomplished by replacing a reactive component, such as a capacitor or inductor, with a synthesized element. The synthesized element creates a signal that corresponds to the response of the reactive component it is replacing. For example, the synthesized element may be used to replace the varactor of FIG. 1, wherein the created signal is injected into the input of the inverter. With such a method and apparatus, a controlled oscillation circuit is provided that operates at low voltages, without steps in the output frequency and without utilizing unnecessary space.

Figure 3:
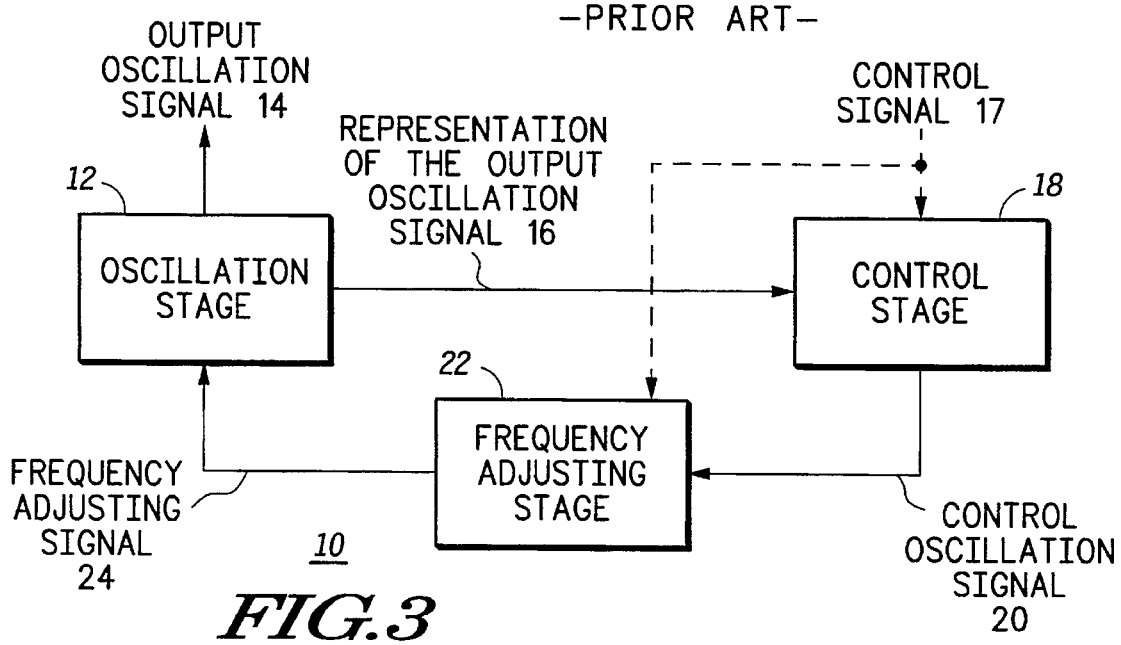
FIG. 3 illustrates, in a block diagram, a circuit for controlling an oscillator in accordance with the present invention.

FIG. 3 illustrates a controlled oscillator circuit 10 that includes an oscillation stage 12, a control stage 18, and a frequency adjusting stage 22. In operation, the oscillation stage 12 generates an output oscillation signal 14, and a representation of the output oscillation signal 16. (Generation of the representation of the output oscillation signal 16 will be discussed below with reference to FIG. 4.) The representation of the output oscillation signal 16 may be an analog or digital signal and includes at least a sinusoidal component. For example, the representation of the output oscillation signal 16 may be a pure sinusoidal, a square wave which is the combination of a plurality of sinusoids or some combination thereof. Additionally, the representation of the output oscillation signal 16 may be phase shifted from the output oscillation signal 14.

The control stage 18 receives the representation of the output oscillation signal 16 and generates a control oscillation signal 20 therefrom. The control oscillation signal 20 is generated by phase shifting the representation of the output oscillation signal 16 by a predetermined amount. For example, if the frequency adjusting stage 22 is synthesizing a capacitor, a voltage representation of the output oscillation signal 16 would be shifted +90 degrees (pi/2) and converted to a current. Alternatively, if the frequency adjusting stage is synthesizing an inductor, a voltage representation of the output oscillation signal 16, would be shifted −90 degrees (−pi/2) and convened to a current.

The control stage 22 may also adjust the magnitude of the control oscillation signal 20 based on a control signal 17. The magnitude adjusted control oscillation signal 20 is received by the frequency adjusting stage 22, which in turn generates a frequency adjusting signal 24. The frequency adjusting signal 24 essentially represents a current as if it were produced by a capacitor, or inductor. This current, along with a reactive component in the oscillation stage, causes the frequency of the output oscillation signal 14 to be adjusted. As one skilled in the art will readily appreciate, the interconnectivity of the oscillation stage and the frequency adjusting stage 22 will dictate whether an increase in current will result in a frequency increase or decrease.

Figure 12:
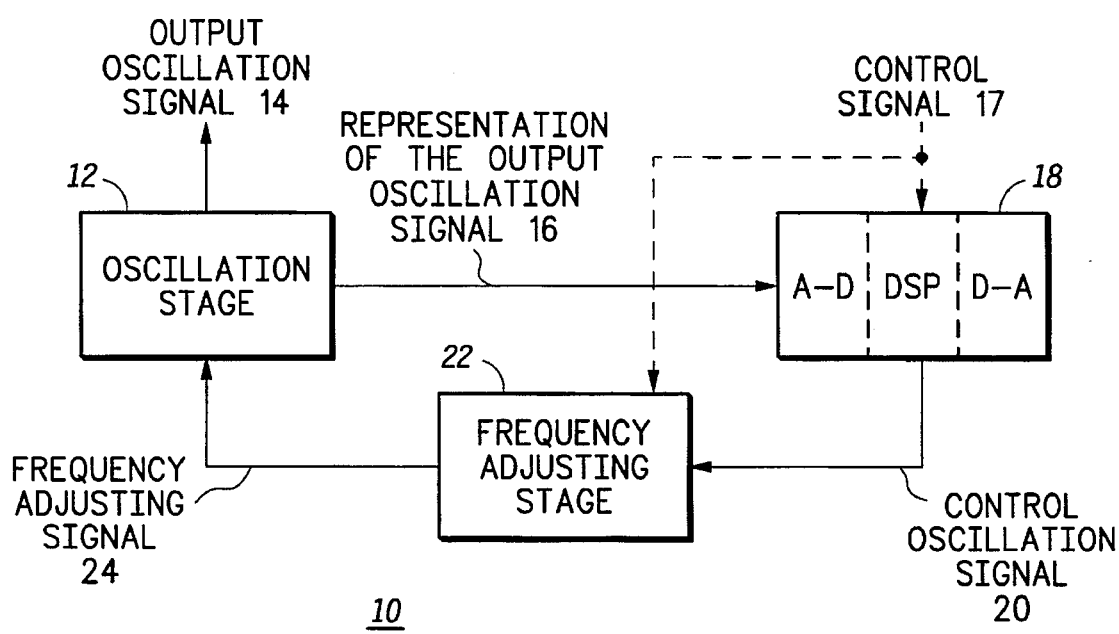
FIG. 12 illustrates, in a block diagram, a circuit for controlling and oscillator in accordance with the present invention.

In a digital signal processor (DSP) embodiment shown in FIG. 12, each of the signals 14, 16, 20, and 24, would be represented by mathematical equations. As is widely known, an analog signal can be represented digitally by performing a Fourier transform on the digitized analog signal. Once the analog signal is represented digitally, it can be scaled or phase shifted by performing shift left, shift right, or inversion operations. Thus, the control oscillation signal 20 may be a digital representation that is mathematically processed by the control stage 18 by phase shifting and/or scaling the representation of the output signal. The digital representation of the control oscillation signal 20, may then be converted back to an analog signal, or further processed by the frequency adjusting stage 22 of the DSP to produce the frequency adjusting signal 24.

Figure 4:
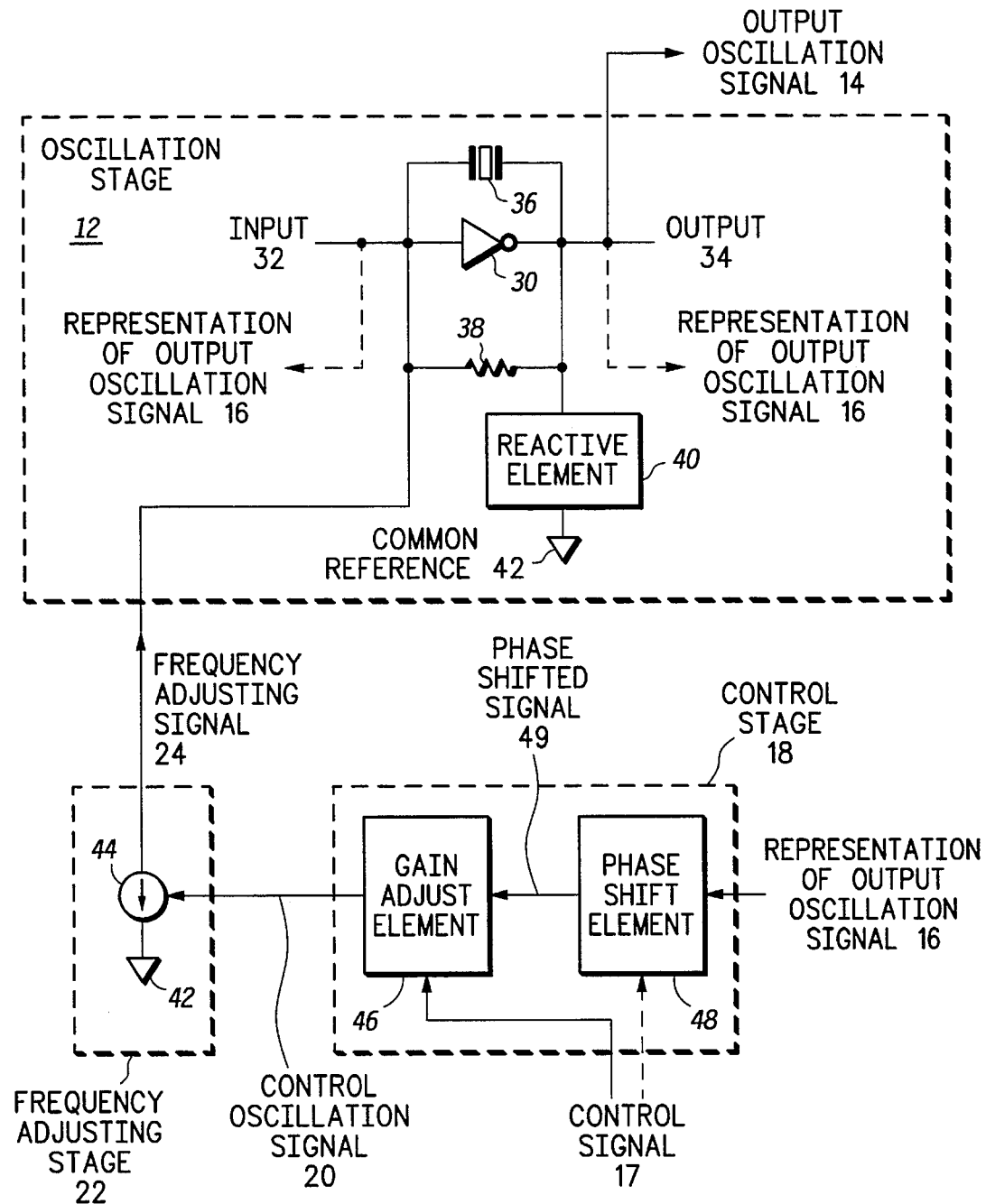
FIG. 4 illustrates, in block diagram and schematic diagram form, a circuit for controlling an oscillator in accordance with the present invention.

Alternatively, the controlled oscillator circuit 10 of FIG. 3 could be implemented discretely as shown in FIG. 4. In this embodiment, the oscillation stage 12 comprises a resonator, such as a crystal oscillator 36, an inverter 30, a resistor 38, a reactive element 40, and a common reference 42. The resonator 36, inverter 30, and resistor 38 are coupled in parallel to provide an output oscillation signal 14, which has a sinusoidal component, at the output of the inverter 30. The reactive element 40, which may be a capacitor or inductor, is connected to the output of the inverter 30 and the common reference 42. The values of the components 36, 38, and 40 will depend on the desired output frequency and the range of frequency adjustment. In a preferred embodiment where a 15 mega-hertz (MHZ) crystal is used, one skilled in the art would typically choose the resistor 38 value to be between 1 mega-ohm and 10 mega-ohm, and the reactive element 40 to be a capacitor with a value between 10 pico-farad and 30 pico-farad.

The oscillator circuit 12 produces the output oscillation signal 14 and the representation of the output oscillation signal 16. As shown, the output oscillation signal 14 is provided at the output of the inverter 30, while the representation of the output 34 oscillation signal 16 may be provided by either the input 32 or the output 34 of the inverter 30. Using the input 32 or the output 34 is a designer's choice based on the desired phasing of the representation of the output oscillation 16.

The frequency of the output oscillation signal 14 is varied based on the frequency adjusting signal 24, which is being supplied by current source 44. The current source 44 is controlled by the control oscillation signal 20, which is produced by the control stage 18. The current source 44, which may be a field effect transistor, may be driven from a low voltage source (less that 3 volts) thereby overcoming one of the prior art limitations.

The control stage 18 comprises a phase shift element 48, a gain adjust element 46, and can receive at least one control signal 17. The representation of the output oscillation signal 16, and the control signal 17 are provided as inputs to the phase shift element 48. If a control signal 17 is not provided, the phase shift element 48 shifts the representation of the output oscillation signal 16 by a fixed amount to create a phase shifted signal 49. The phase shift amount will depend on the implementation, but will generally be +90 degrees if the frequency adjusting signal 24 is synthesizing a capacitor and will generally be −90 degrees is the frequency adjusting signal 24 is synthesizing an inductor. If a control signal 17 is used, the phase shifted amount will be varied based on the control signal or it may select a +90 degree phase shift or a −90 degree phase shift. Implementations of the phase shift element 48 will be discussed in more detail with reference to FIG. 5 and FIG. 6.

The phase shifted signal 49 and the control signal 17 are provided as inputs to the gain adjust element 46, which generates a control oscillation signal 20. If the control signal 17 is not used, the gain adjust element 48 adjusts the magnitude of the phase shifted signal by a fixed amount to generate the control oscillation signal 20. If the control signal 17 is used, the gain adjust element 46 varies the magnitude of the phase shifted signal based on the control signal.

Figure 5:
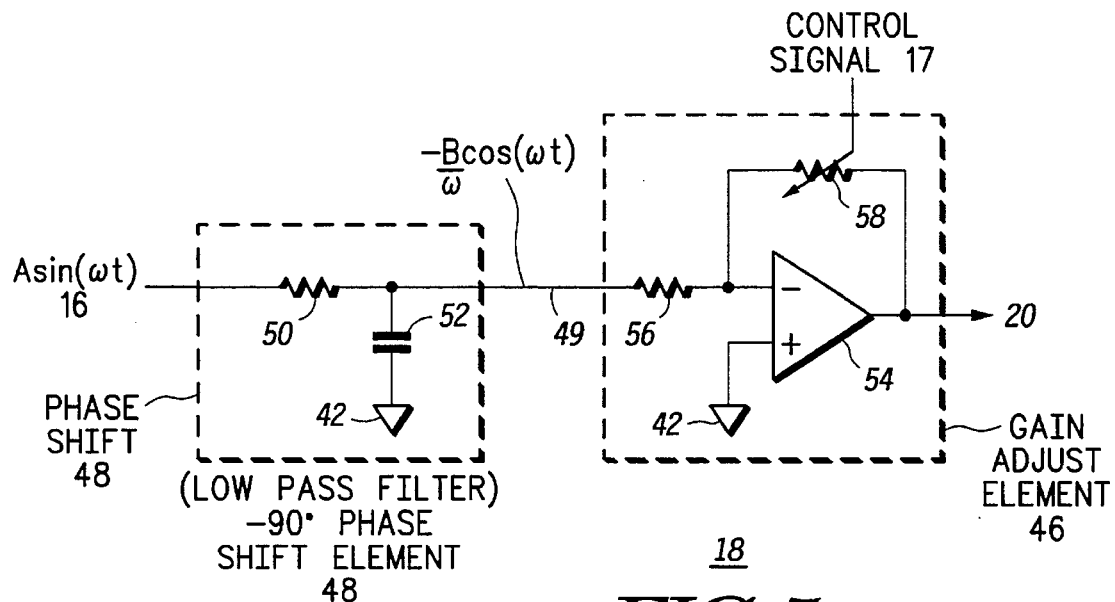
FIG. 5 illustrates, in a schematic diagram, a low pass element for shifting phase and adjusting gain of a signal.

FIG. 5 illustrates one embodiment of the control stage 18. The representation of the output oscillation signal 16 (A sin(wt)) is provided as an input to the phase shift element 48, which functions as a low pass filter. In particular, the phase shift element 48 comprises a resistor 50, a capacitor 52, and a common reference 42. The representation of the output oscillation signal 16 is filtered by the resistor 50 and the capacitor 52 to produce the phase shifted signal (−B/w cos(wt)). As one skilled in the art will readily appreciate, the values of the resistor 50 and the capacitor 52 will be chosen based on the frequency (w) of the output oscillator signal 14 to provide the −90 degree phase shift.

The gain adjust element 46 embodied in FIG. 5 comprises an operational amplifier 54 (op-amp), a resistor 56, a variable resistor 58, and a common reference 42. The resistor 56 receives the phase shifted signal 49 on one node and is connected to an input of op-amp 54 on the other node. The variable resistor 58 is controlled by the control signal 17, and is connected as feedback for the op-amp 54. Given these parameters, the opamp 54 generates the control oscillation signal 20, which has a variable amplitude based on the control signal. By having the feedback a variable resistor 58, the output frequency can be smoothly adjusted, thereby overcoming one of the prior art problems of having the output frequency adjusted in a step-like manner.

Figure 6:
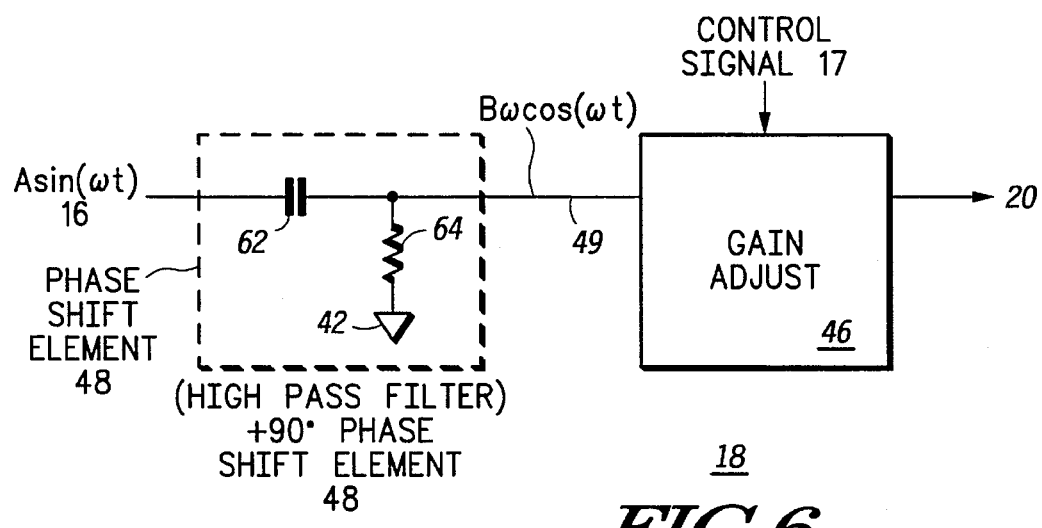
FIG. 6 illustrates, in a schematic diagram, a high pass element for shifting phase and adjusting gain of a signal.

FIG. 6 illustrates another embodiment of the control stage 18. The phase shift element 48 is implemented using a high pass filter and is embodied using a resistor 64, a capacitor 62, and a common reference 42. The representation of the output oscillation signal 16 (A sin(wt)) is shifted +90 degrees by the high pass filter. As with the low pass filter of FIG. 5, the values are chosen based on the desired ouput frequency.

Figure 7:
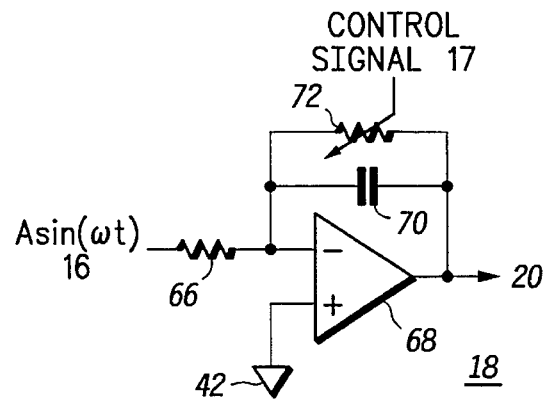
FIG. 7 illustrates, in a schematic diagram, an alternate low pass element for shifting phase and adjusting gain of a signal.
Figure 8:
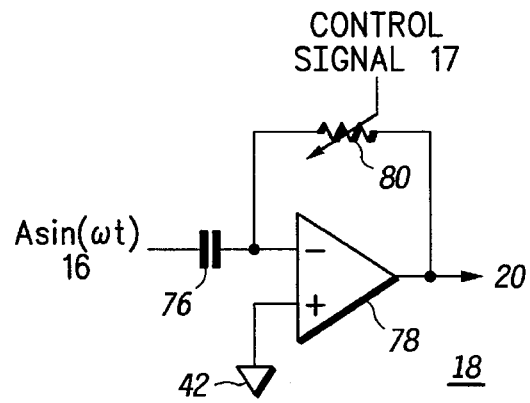
FIG. 8 illustrates, in a schematic diagram, an alternate high pass element for shifting phase and adjusting gain of a signal.

FIG. 7 and FIG. 8 illustrate alternate methods of shifting phase and controlling gain of a signal with a sinusoidal component, through the use of an operational amplifier.

Figure 9:
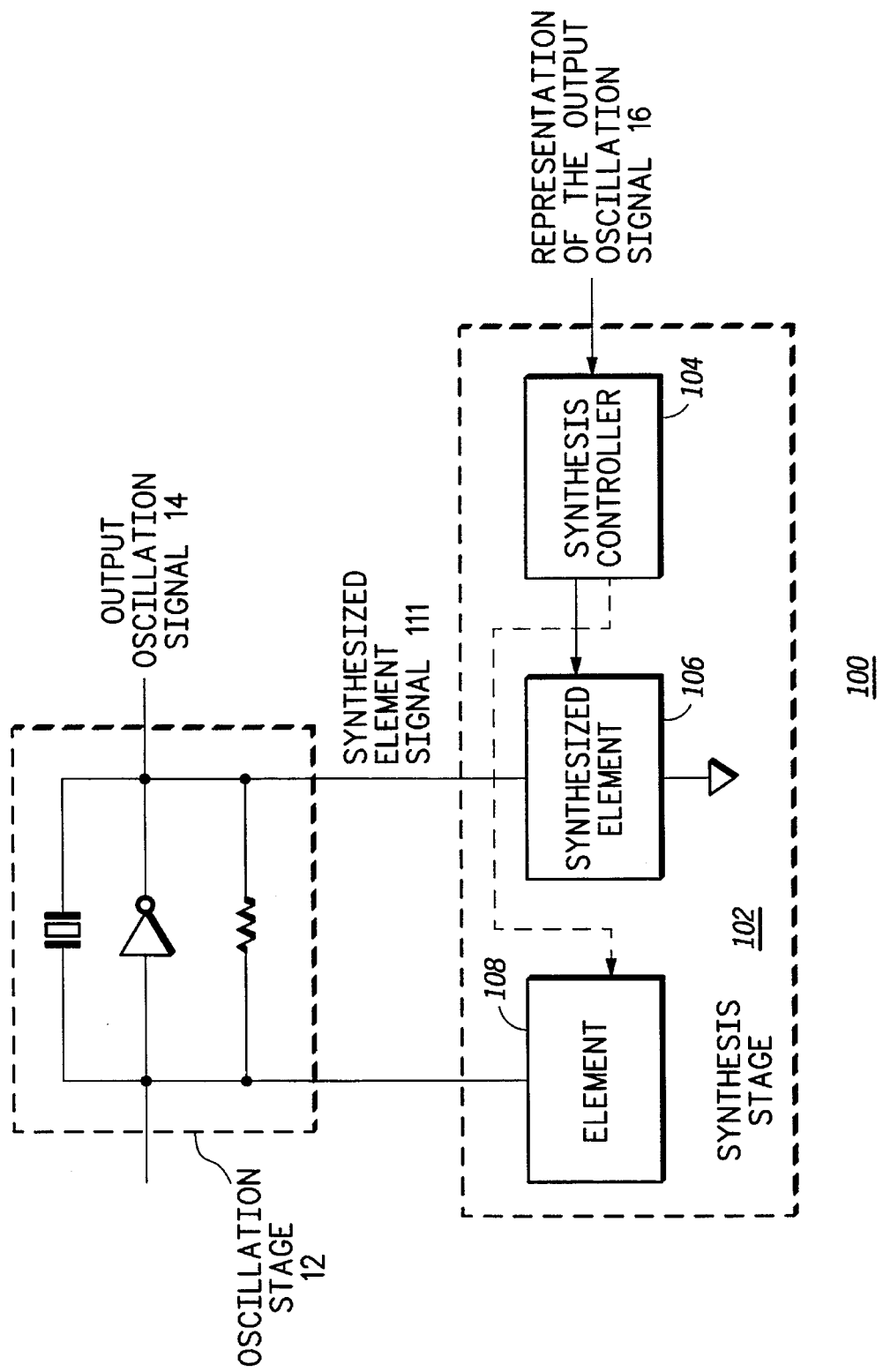
FIG. 9 illustrates, in a block diagram, a circuit for controlling an oscillator in accordance with the present invention.

FIG. 9 illustrates an alternate controlled oscillator circuit 100 that includes the oscillation stage 12, and a synthesis stage 102. In operation, the oscillation stage 12 generates an output oscillation signal 14, and a representation of the output oscillation signal 16. In this implementation, the oscillation stage 12 has no reactive element 40 as in the previous embodiment. The synthesis stage 102 comprises an element 108 and a synthesized element 106 which can be controlled by a synthesis controller 104. The synthesis controller 104 receives the representation of the output oscillation signal 16, and generates the control signal for the synthesized element 106. The synthesized element 106 produces a synthesized element signal 111. In this embodiment, both elements 108 and 106 may be synthesized. The synthesis controller 104 may be equivalent to control stage 18 (FIG. 3), while the elements 108 and 106 may be current sources.

Figure 10:
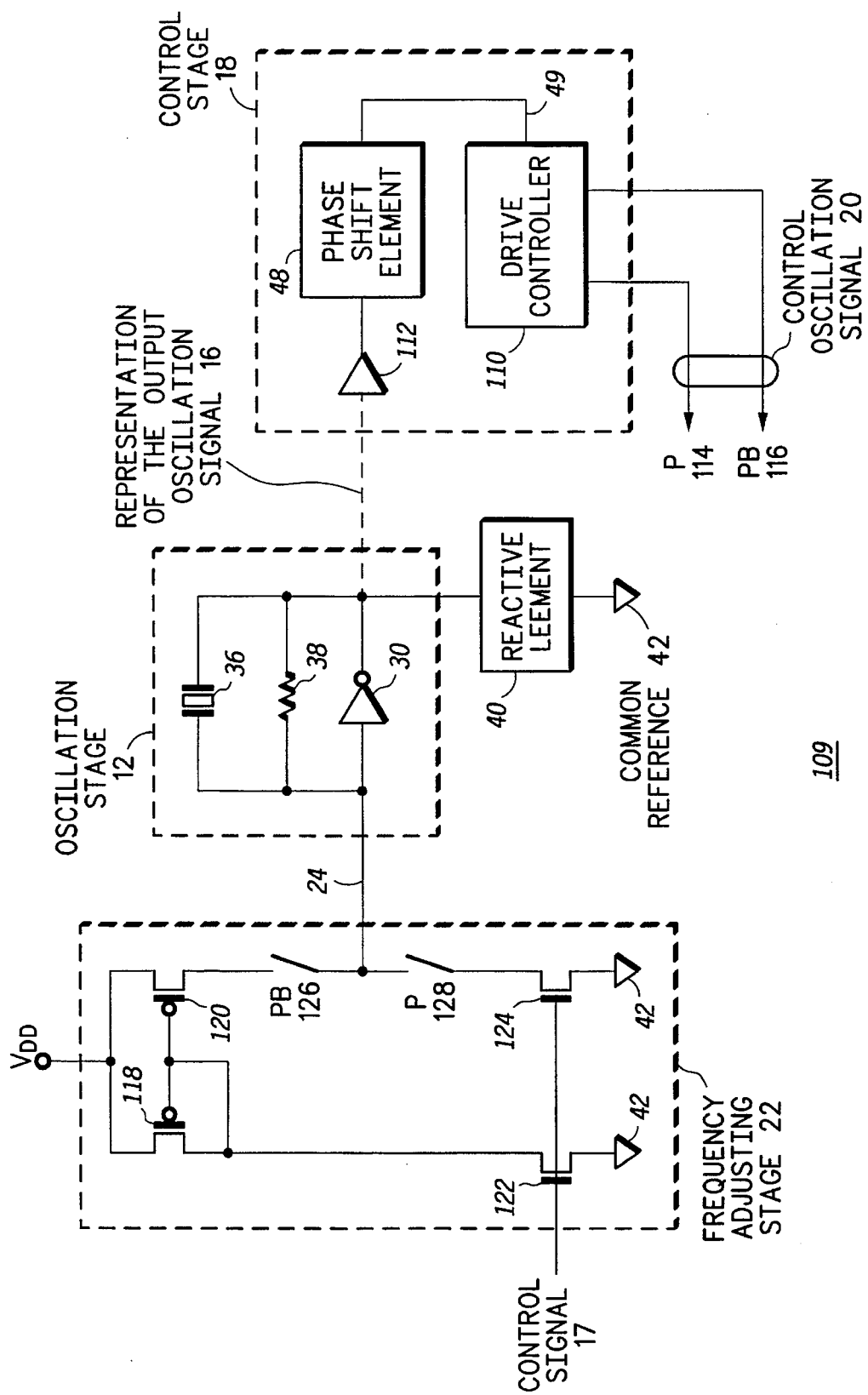
FIG. 10 illustrates, in block diagram and schematic diagram form, a circuit for digitally controlling an oscillator in accordance with the present invention.

FIG. 10 illustrates a digitally controlled oscillation circuit 109. The control stage 18 comprises a buffer element 112 and through sufficient amplification, the buffer element 112 can be used to create a square wave. This signal is phase shifted by the phase shift element 48. A drive controller 110 receives the phase shifted signal 49 and creates a signal P 114, which is capable of driving a logic switch, and a signal PB 116, which is also capable of driving a logic switch. Note that signal PB 116 is the inverse of signal P 114. The control oscillation signal 20 comprises P 114 and PB 116 and is received by the frequency adjusting stage 22, which comprises transistors 118, 120, 122, 124, switches 126, 128, and a common reference 42. One switch 128 is controlled by signal P 114, while the other switch 126 is controlled by signal PB. In operation, the configuration of signal P 114 and signal PB 116 assures that exactly one switch will be open at all times, thereby allowing transistor 122, 124, 118, and 120 to alternately source or sink current based on the control oscillation signal 20, and control signal 17.

Figure 11:
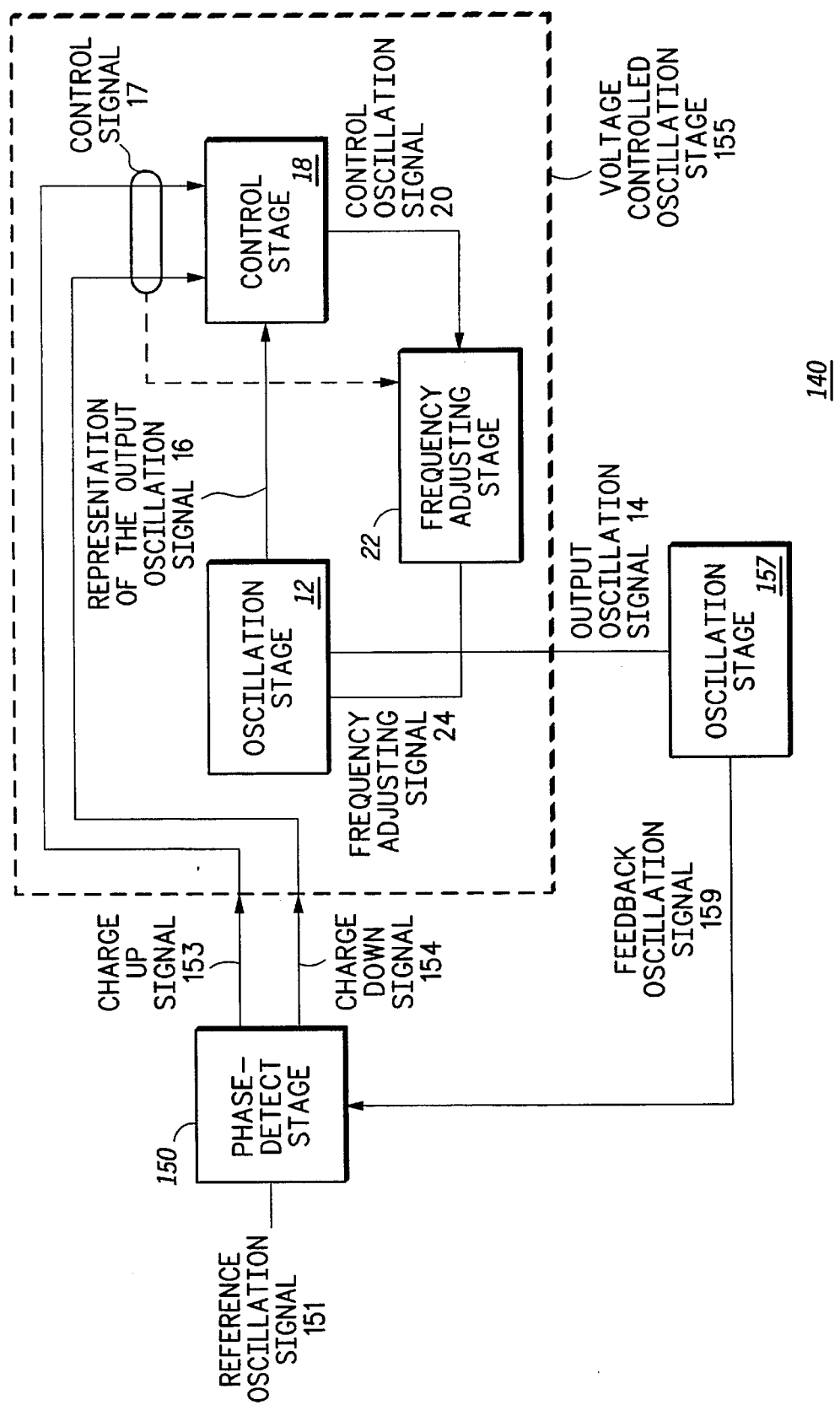
FIG. 11 illustrates, in a block diagram, a phase locked loop circuit in accordance with the present invention.

FIG. 11 illustrates a phase locked loop (PLL) circuit 140 which includes the controlled oscillator circuit 10 of FIG. 3. The PLL circuit 140 comprises a phase-detect stage 150, a voltage controlled oscillator (VCO) stage 155, and a feedback stage 157. The VCO stage 155, which embodies the controlled oscillation circuit of FIG. 3, receives a charge up signal or a charge down signal and, based on their values, will either increase or decrease the frequency of the output oscillation signal 14. By modifying the frequency of the output oscillation signal 14, the phase and duration of the feedback oscillation signal 159 can be made to match the reference oscillation signal 151.

The present invention provides a method and apparatus for controlling an oscillator. By synthesizing at least one of the reactive elements in the oscillation stage, the oscillator can operate at low voltages (less than 3 volts), provide continuous output frequency adjustments without using unnecessary space.

We claim:

1. A controlled oscillator circuit that produces an output oscillation signal comprising:

an oscillation stage that generates the output oscillation signal based, at least in part, upon a frequency adjusting signal; and a reactive element synthesizer for synthesizing a reactive device, the reactive element synthesizer operably coupled to the oscillation stage to receive a representation of the output oscillation signal, and to provide a frequency adjusting signal, wherein the oscillation stage receives the frequency adjusting signal and adjusts the frequency of the output oscillation signal based on the frequency adjusting signal, the reactive element synthesizer comprising:

a control stage operably coupled to receive the representation of the output oscillation signal, wherein the control stage modifies the representation of the output oscillation signal to produce a control oscillation signal; and a frequency adjusting stage operably coupled to the control stage, wherein the frequency adjusting stage receives the control oscillation signal and produces therefrom the frequency adjusting signal.

2. The controlled oscillator circuit of claim 1, wherein the reactive element synthesizer further comprises an input for receiving a control signal.

3. The controlled oscillator circuit of claim 1, wherein the control stage further comprises a phase shift element operably coupled to receive the representation of the output oscillation signal and to produce the control oscillation signal.

4. The controlled oscillator circuit of claim 3, wherein the control stage further comprises a gain adjust element, wherein the gain adjust element and phase shift element produce the control oscillation signal.

5. The controlled oscillator circuit of claim 3, wherein:

the control stage further comprises a drive controller operably coupled to the phase shift element, wherein the drive controller generates the control oscillation signal, wherein the control oscillation signal comprises a first signal and a second signal; and the frequency adjusting stage further comprises transistors capable of sinking or sourcing current based on the first signal and the second signal.

6. The controlled oscillator circuit of claim 3 wherein the phase shift element further comprises an all pass filter.

7. The controlled oscillator circuit of claim 3 wherein the phase shift element further comprises a high pass filter.

8. The controlled oscillator circuit of claim 1, wherein the oscillation stage further comprises:

an inverter having an input to receive the frequency adjusting signal and an output;

a resonator coupled to the output and the input; and a resistor coupled in parallel with the inverter.

9. The controlled oscillator circuit of claim 8, wherein the oscillation stage further comprises a reactive element coupled between the output and a common reference, and the reactive element synthesizer is coupled to the input.

10. The controlled oscillator circuit of claim 8, wherein the control stage is operably coupled to the output to receive the representation of the output oscillation signal.

11. The controlled oscillator circuit of claim 8, wherein the control stage is operably coupled to the input to receive the representation of the output oscillation signal.

12. The controlled oscillator circuit of claim 8, wherein the frequency adjusting stage comprises a current source coupled to the input.

13. The controlled oscillator circuit of claim 12, wherein the current source comprises a field effect transistor.

14. A controlled oscillator circuit that produces an output oscillation signal comprising:

an oscillation stage having an oscillation stage input, a crystal oscillator, and an oscillation stage output, wherein the oscillation stage provides the output oscillation signal at the oscillation stage output; and a synthesis stage operably coupled to the oscillation stage, wherein the synthesis stage at least partially, adjusts frequency of the output oscillation signal by synthesizing a reactive element to produce a synthesized element.

15. The controlled oscillator circuit of claim 14, wherein the synthesis stage further comprises a synthesis controller operably coupled to a representation of the output oscillation signal and the synthesized element.

16. The controlled oscillator circuit of claim 15, wherein the synthesis controller is coupled to the oscillation stage output to receive the representation of the output oscillation signal.

17. The controlled oscillator circuit of claim 15, wherein the synthesis controller is coupled to the oscillation stage input to receive the representation of the output oscillation signal.

18. The controlled oscillator circuit of claim 14, wherein the synthesized element is operably coupled to the oscillation stage input.

19. The controlled oscillator circuit of claim 14, wherein the synthesized element is operably coupled to the oscillation stage output.

20. A digitally controlled oscillator circuit that produces an output oscillation signal comprising:

an inverter having an inverter input and an inverter output a resonator coupled to the inverter input and the inverter output;

a reactive element coupled to the inverter output and a common reference;

a buffer element having a buffer input and a buffer output, wherein the buffer input is operably coupled to the inverter output;

a phase shift element having a phase shift input and a phase shift output, wherein the phase shift input is operably coupled to the buffer output;

a drive controller having a drive input, a first drive output and a second drive output, wherein the drive input is operably coupled to the phase shift input; and a transistor set having a source input and a source output, wherein the source output is operably coupled to the inverter input, and the transistor set is operably coupled to the first drive output and the second drive output to control direction of current in the transistor set, wherein the source input is operably coupled to a control signal.

21. A phase locked loop circuit that produces an oscillation signal comprising:

a phase-detect stage operably coupled to a reference oscillation signal, and a feedback oscillation signal, wherein the phase-detect stage generates a charge up signal or a charge down signal based on a difference between the reference oscillation signal and the feedback oscillation signal;

a voltage controlled oscillator stage operably coupled to receive the charge up signal and the charge down signal, and generates therefrom an output oscillation signal, wherein the voltage controlled oscillator stage includes:

an oscillation stage that generates the output oscillation signal based, at least in part, upon a frequency adjusting signal;

a reactive element synthesizer for synthesizing a reactive device, the reactive element synthesizer operably coupled to the oscillation stage to receive a representation of the output oscillation signal, and to provide a frequency adjusting signal, wherein the oscillation stage receives the frequency adjusting signal and adjusts the frequency of the output oscillation signal based on the frequency adjusting signal, the reactive element synthesizer comprising:

a control stage operably coupled to receive the representation of the output oscillation signal, wherein the control stage modifies the representation of the output oscillation signal to produce a control oscillation signal; and a frequency adjusting stage operably coupled to the control stage, wherein the frequency adjusting stage receives the control oscillation signal and produces therefrom the frequency adjusting signal.

22. The circuit of claim 1, wherein the oscillation stage further comprises a resonating device coupled in parallel to an inverting device.

23. The circuit of claim 1, wherein the reactive device comprises a variable reactive element.

24. The circuit of claim 23, wherein the variable reactive element further comprises a varactor.

25. The circuit of claim 23, wherein the controlled oscillator circuit comprises a controlled oscillator circuit for use within a phase locked loop.

26. The controlled oscillator circuit of claim 3 wherein the phase shift element further comprises a low pass filter.

27. A voltage controlled crystal oscillator that produces an output oscillation signal comprising:

an oscillation stage comprising an inverting device and a resonating device that generates the output oscillation signal based, at least in part, upon a frequency adjusting signal;

a control stage operably coupled to the oscillation stage, wherein the control stage modifies a representation of the output oscillation signal to produce a control oscillation signal; and a frequency adjusting stage for synthesizing a reactive device operably coupled to the control stage and the oscillation stage, wherein the frequency adjusting stage receives the control oscillation signal and produces therefrom the frequency adjusting signal, wherein the oscillation stage adjusts frequency of the output oscillation signal based on the frequency adjusting signal.

28. A controlled oscillator circuit that produces an output oscillation signal comprising:

an oscillation stage that generates the output oscillation signal based, at least in part, upon a frequency adjusting signal;

a control stage operably coupled to the oscillation stage, wherein the control stage modifies a representation of the output oscillation signal to produce a control oscillation signal, the control stage comprising:

an analog-to-digital converter for receiving the output oscillation signal and converting it to a digital representation of the output oscillation signal;

a digital data processor for modifying the digital representation of the output oscillation signal to produce a digital signal for synthesizing a reactive device:

a digital-to-analog converter for receiving the digital signal for synthesizing a reactive device and producing the control oscillation signal; and a frequency adjusting stage for synthesizing a reactive device operably coupled to the control stage and the oscillation stage, wherein the frequency adjusting stage receives the control oscillation signal and produces therefrom the frequency adjusting signal, wherein the oscillation stage adjusts frequency of the output oscillation signal based on the frequency adjusting signal.

* * * * *